(12) United States Patent
Lin et al.

(10) Patent No.: US 8,981,387 B2
(45) Date of Patent: Mar. 17, 2015

(54) LIGHT EMITTING DIODE ASSEMBLY HAVING A DEFORMABLE LENS

(71) Applicant: Advanced Optoelectronic Technology, Inc., Hsinchu Hsien (TW)

(72) Inventors: Hou-Te Lin, Hsinchu (TW); Chao-Hsiung Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 70 days.

(21) Appl. No.: 13/717,708

(22) Filed: Dec. 18, 2012

(65) Prior Publication Data
US 2013/0168716 A1 Jul. 4, 2013

(30) Foreign Application Priority Data
Dec. 29, 2011 (CN) .................. 2011 1 0450544

(51) Int. Cl.
| | | |
|---|---|---|
| H01L 27/15 | (2006.01) | |
| H01L 29/26 | (2006.01) | |
| H01L 31/12 | (2006.01) | |
| H01L 33/00 | (2010.01) | |
| H01L 29/267 | (2006.01) | |
| H01L 29/16 | (2006.01) | |
| H01L 29/205 | (2006.01) | |
| H01L 21/00 | (2006.01) | |
| H01L 33/58 | (2010.01) | |

(52) U.S. Cl.
CPC ......... *H01L 33/58* (2013.01); *H01L 2924/0002* (2013.01)

USPC .................. 257/81; 257/79; 257/80; 257/82; 257/91; 257/95; 257/98; 257/99; 257/100; 438/51; 438/55; 438/64

(58) Field of Classification Search
None
See application file for complete search history.

(56) References Cited

U.S. PATENT DOCUMENTS

2010/0060157 A1\* 3/2010 Shi .............................. 313/512

FOREIGN PATENT DOCUMENTS

| JP | 61294401 A | 12/1986 | | |
|---|---|---|---|---|
| JP | 2006-258986 | \* | 9/2006 | |
| JP | 2006258986 A | \* | 9/2006 | ..................... 257/98 |
| JP | 2008077104 A | | 4/2008 | |

\* cited by examiner

*Primary Examiner* — Steven Loke
*Assistant Examiner* — Juanita B Rhodes
(74) *Attorney, Agent, or Firm* — Novak Druce Connolly Bove + Quigg LLP

(57) ABSTRACT

A light emitting diode assembly includes a base, a light emitting chip mounted on the base, an elastic lens covering the light emitting chip, two rotation members rotatably arranged on the base, and two stopper poles fixed on the base. The two rotation members are capable of driving the elastic lens to rotate with respect to the two stopper poles. The stopper poles compress the elastic lens to cause the elastic lens to deform resiliently when the elastic lens is rotated by the rotation members to engage with the stopper poles.

13 Claims, 7 Drawing Sheets

LIGHT EMITTING DIODE ASSEMBLY HAVING A DEFORMABLE LENS

BACKGROUND

1. Technical Field

The present disclosure generally relates to illuminating assemblies, and particularly to a light emitting diode (LED) assembly which has adjustable light distribution.

2. Description of the Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

An LED package generally includes a substrate, an LED chip arranged on the substrate, and a lens fixed on the substrate by glue to adjust light from the LED die. However, the lens is usually configured with a given curvature, thereby achieving a predetermined and unchangeable light distribution. As such, the LED package is unable to satisfy various illumination requirements.

Therefore, it is desirable to provide a light emitting diode assembly to overcome the above mentioned shortcomings.

BRIEF DESCRIPTION OF THE DRAWINGS

The components of the drawings are not necessarily drawn to scale, the emphasis instead being placed upon clearly illustrating the principles of the embodiments of the display device. Moreover, in the drawings, like reference numerals designate corresponding parts throughout several views.

DETAILED DESCRIPTION

Figure 1:
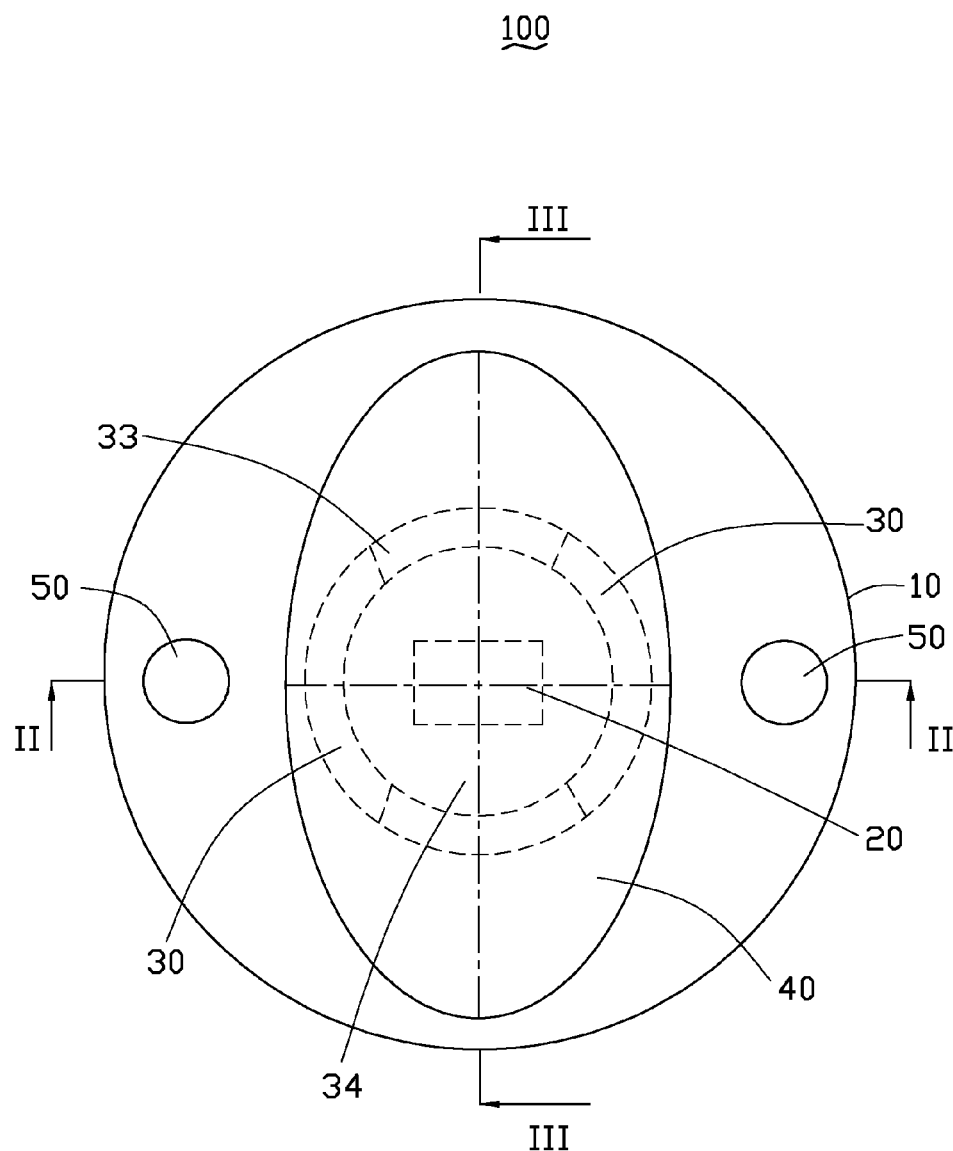
FIG. 1 is a top view of a light emitting diode assembly according to a first embodiment of the present disclosure, which is in an original state.

Referring to FIG. 1, a light emitting diode assembly 100 in accordance with a first embodiment of the disclosure is shown. The light emitting diode assembly 100 includes a base 10, a light emitting chip 20 arranged on the base 10, two rotation members 30 arranged on the base 10 and surrounding the light emitting chip 20, a lens 40 fixed on and supported by the two rotation members 30, and two stopper poles 50 extending upwardly from the base 10.

Figure 2:
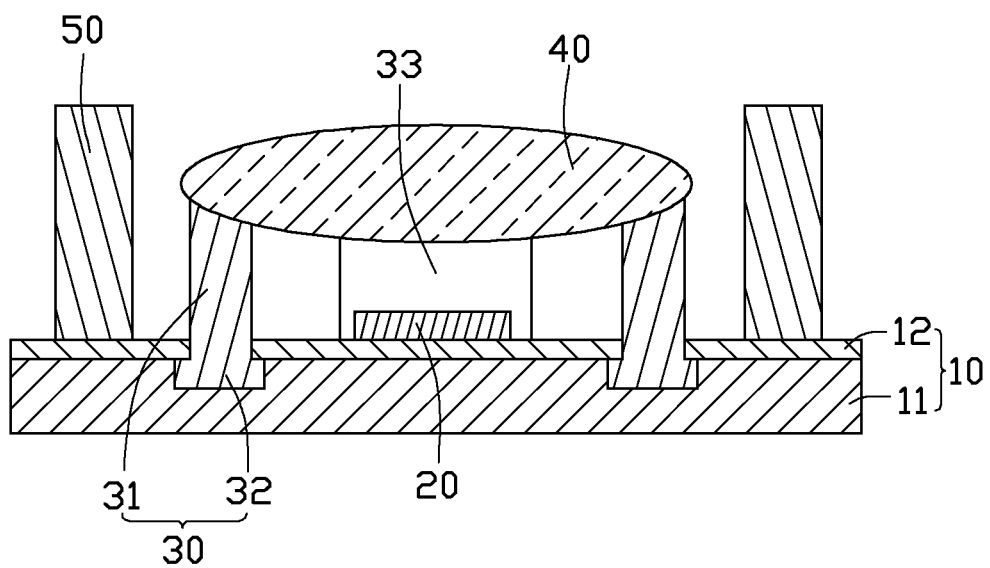
FIG. 2 is a cross-sectional view of the light emitting diode assembly of FIG. 1, taken along II-II thereof.
Figure 3:
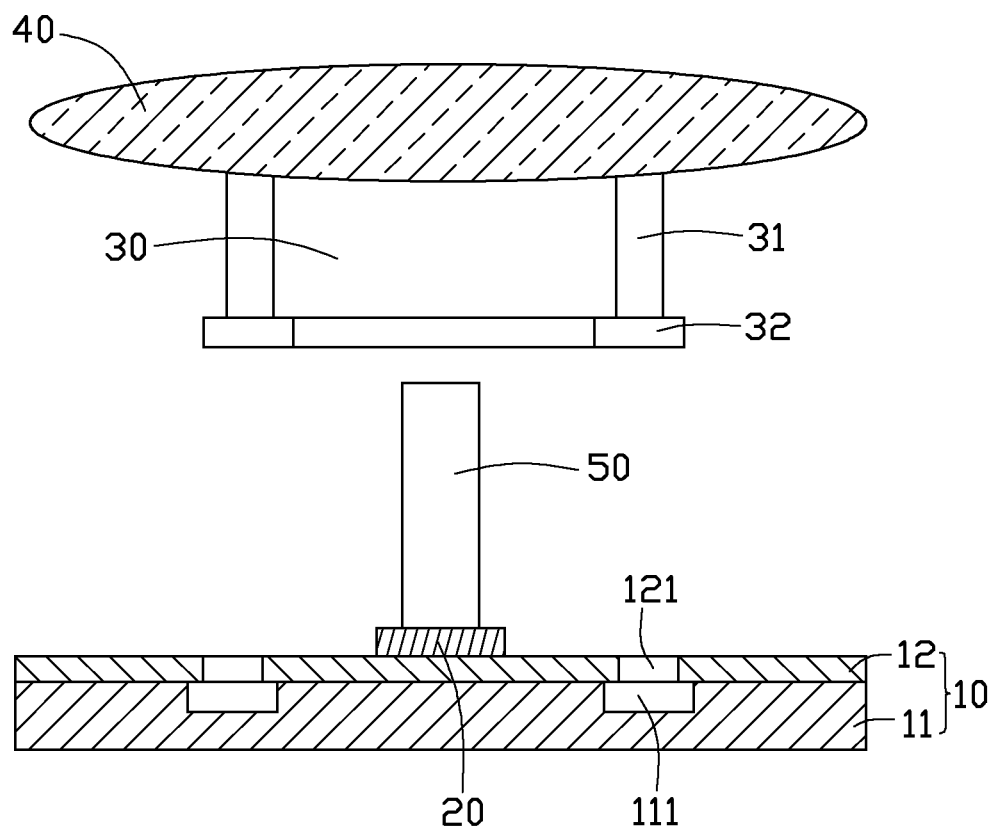
FIG. 3 is an exploded, cross-sectional view of the light emitting diode assembly of FIG. 1, taken along III-III thereof.

Referring to FIG. 2 and FIG. 3, the base 10 includes a rear plate 11, and a substrate 12 attached to a top surface of the rear plate 11. The rear plate 11 is parallel to the substrate 12. The rear plate 11 and the substrate 12 each can have a round, rectangular, hexagon or other shape. In this embodiment, the rear plate 11 and the substrate 12 are both round. The rear plate 11 is made of thermally conductive materials, such as metal, thermally conductive ceramic and so on. The substrate 12 is made of thermally conductive and electrically insulated materials, such as epoxy resin, silicone resin, polyphthalamide (PPA) and so on. The rear plate 11 includes an annular receiving groove 111 formed in the top surface thereof. The substrate 12 includes an annular slot 121 located directly over the annular receiving groove 111 and penetrating through the substrate 12 along a thickness direction thereof. The annular receiving groove 111 and the annular slot 121 are concentric and communicated with each other. The annular receiving groove 111 has a width, along a radius direction thereof, which is larger than that of the annular slot 121. The substrate 12 has electrodes (not illustrated) arranged thereon for providing electric power to the light emitting chip 20.

The light emitting chip 20 is arranged on a center of the substrate 12, and surrounded by the annular slot 121. In this embodiment, the light emitting chip 20 is assembled to the substrate 12 by flip chip, and electrically connected to the electrodes arranged on the substrate 12.

The two rotation members 30 are arranged at two opposite sides of the light emitting chip 20, apart from and facing towards each other. Each rotation member 30 includes a curved wall 31 and a foot 32 connected with a bottom of the curved wall 31. The curved wall 31 is perpendicular to the substrate 12 and the rear plate 11, and above the rear plate 11. Each curved wall 31 has an arc-like configuration as viewed from the top of the light emitting diode assembly 100 and is concentric with the annular slot 121. The foot 32 extends inward and outward from the bottom of the corresponding curved wall 31 along radius directions of the annular slot 121 and the annular receiving groove 111. Thereby the foot 32 is fittingly and slideably embedded in the annular receiving grove 111, and the bottom of the curved wall 31 is fittingly and slideably embedded in the annular slot 121. Accordingly, the two rotation members 30 are capable of sliding along the annular receiving grove 111 and the annular slot 121. Due to the two rotation members 30 being apart from each other, a gap 33 is defined between neighboring lateral edges of the two rotation members 30. Further, a receiving chamber 34 is bounded by the two rotation members 30 cooperatively for accommodating the light emitting chip 20.

The lens 40 is arranged directly above the light emitting chip 20 for adjusting light distribution of the light emitting chip 20. The lens 40 is mounted on the two rotation members 30. The lens 40 can be a convex lens made of transparent and resilient materials, such as silica gel, rubber and so on. As such, the lens 40 can be deformed resiliently when an external force is applied thereon. An orthographic projection of the lens 40 on the base 10 is an ellipse. A central thickness of the lens 40 is larger than a peripheral thickness thereof. In this embodiment, the lens 40 has a gradually decreasing thickness along a direction from a center to a periphery edge thereof. Two lateral sides of the lens 40, along a minor axis of the projected ellipse, are fixed on top portions of the curved walls 31.

The two stopper poles 50 are both perpendicular to the rear plate 11 and the substrate 12, i.e. perpendicular to the base 10. The two stopper poles 50 both are column shaped, and are arranged at opposite lateral sides of the light emitting chip 20. The two stopper poles 50 are also arranged at opposite lateral sides of the rotation members 30 and the lens 40. Each stopper pole 50 has a height, along a direction away from and perpendicular to the base 10, no less than that of the lens 40. A distance between the two stopper poles 50 is between the lengths of the minor axis and major axis of the projected ellipse, i.e. the orthographic projection of the lens 40 on the base 10 when the lens 40 is at its natural state as shown in FIG. 1. In other words, the distance between the two stopper poles 50 is smaller than a length of the major axis of the projected ellipse, and larger than a length of the minor axis of the projected ellipse.

When the light emitting diode assembly 100 is working with the lens 40 in its natural state (i.e., not deformed), light beams emitted from the light emitting chip 20 can be modulated by a normal capability of the lens 40 having an original shape.

Figure 4:
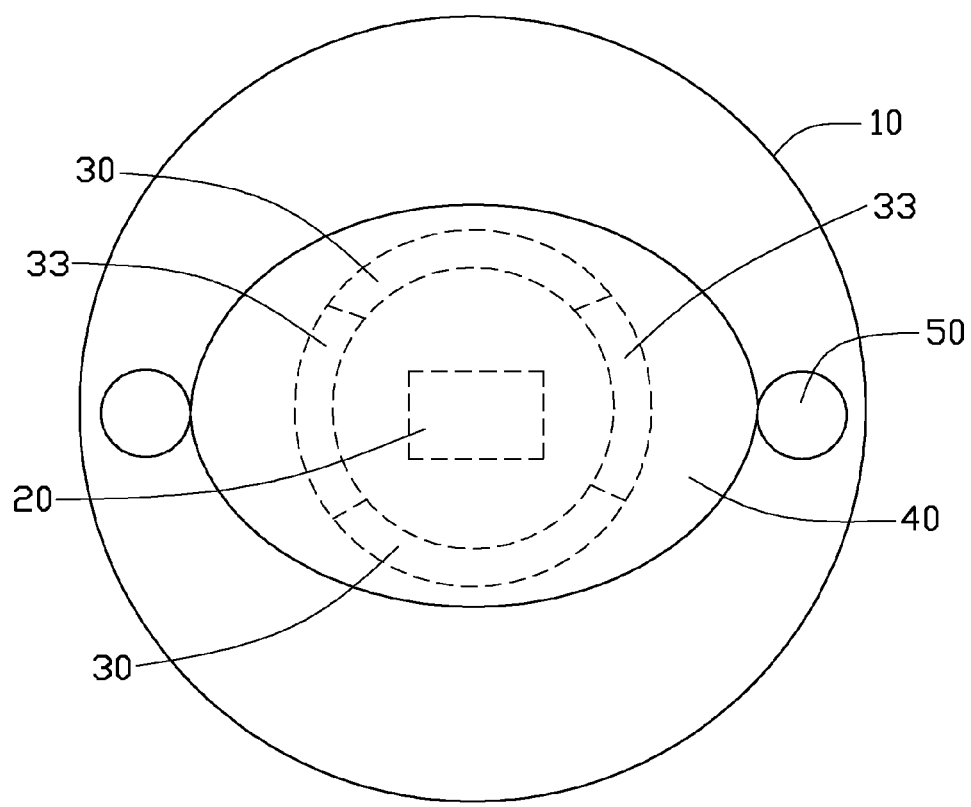
FIG. 4 is a top view of the light emitting diode assembly according to the first embodiment of the present disclosure, which is in a deformed state.

When the two rotation members 30 are rotated to drive the lens 40 to rotate, two ends at the major axis of the ellipse-shaped lens 40 will be moved to be first engaged by the stopper poles 50. Since the lens 40 is deformable, future rotation of the rotation members 30 causes the lens 40 to be compressed by the two stopper poles 50, whereby the lens 40 is deformed with the length of the major axis being decreased and the length of the minor axis being increased, as illustrated in FIG. 4. As such, the lens 40 made of elastic material is deformed resiliently to have a different configuration whereby the lens 40 has an altered capability for modulating the light from the LED chip 20. Accordingly, light beams emitted from the light emitting chip 20 can be modulated to have different patterns of distribution by different capabilities of the lens 40 at different positions with correspondingly different shapes, thereby achieving adjustable light field distributions of the light emitting diode assembly 100 to satisfy various illumination requirements.

Figure 5:
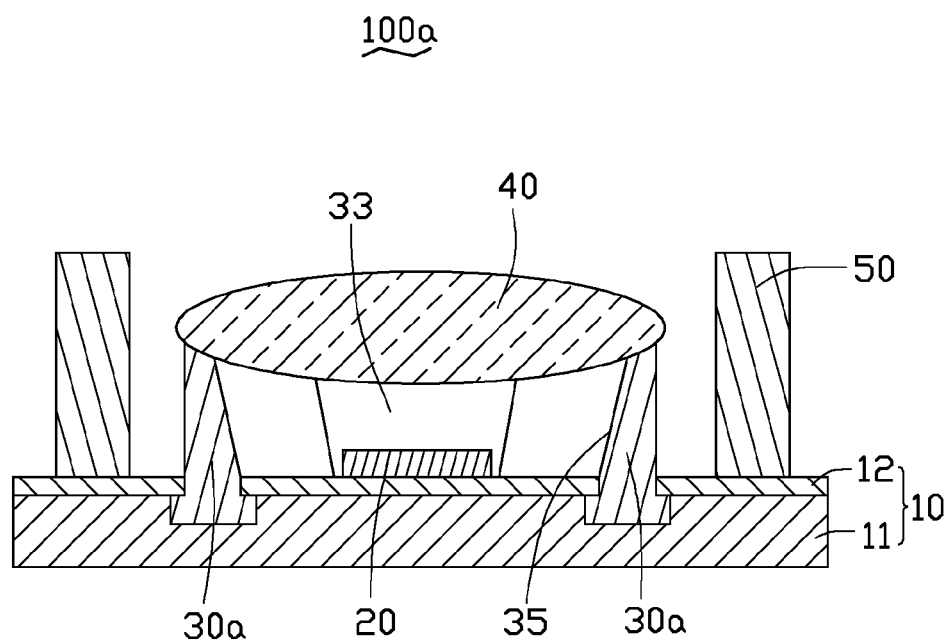
FIG. 5 is a cross-sectional view of a light emitting diode assembly according to a second embodiment of the present disclosure.

Referring to FIG. 5, a light emitting diode assembly 100a in accordance with a second embodiment of the disclosure is shown. The light emitting diode assembly 100a has a configuration similar to the light emitting diode assembly 100 of the first embodiment. What is different from the light emitting diode assembly 100 is that, the rotation members 30a of the light emitting diode assembly 100a each include an inclined sidewall functioning as a light reflecting surface 35. The light reflecting surface 35 extends from the top portion of the curved wall 31 downward and slantwise towards the light emitting chip 20. Accordingly, a horizontal distance between the rotation member 30a and the light emitting chip 20 gradually decreases along a vertical direction from the lens 40 to the substrate 12. As such, light emitted from the light emitting chip 20 can be reflected towards the lens 40 by the light reflecting surface 35, thereby improving a brightness of the light emitting diode assembly 100a.

Figure 6:
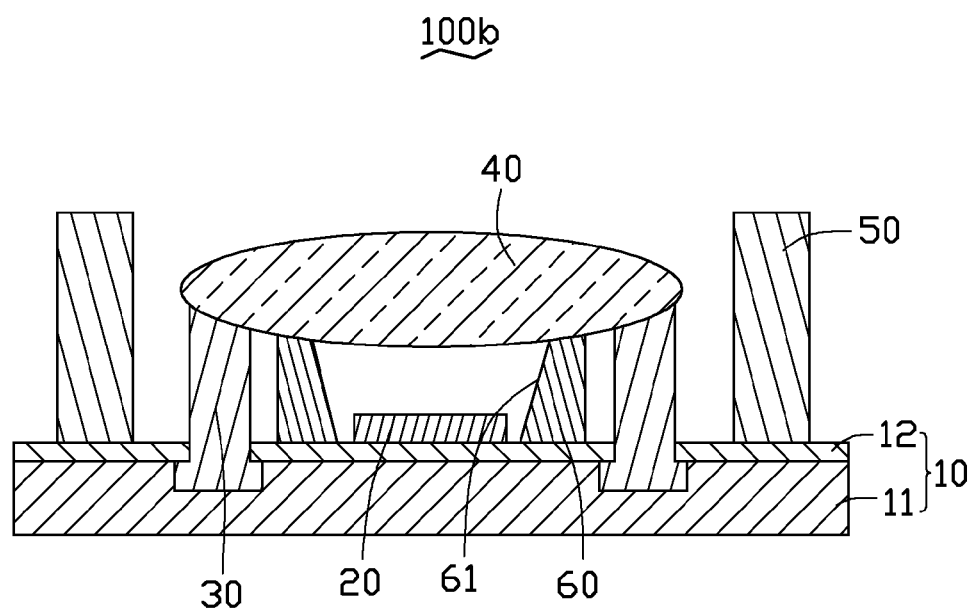
FIG. 6 is a cross-sectional view of a light emitting diode assembly according to a third embodiment of the present disclosure.

Referring to FIG. 6, a light emitting diode assembly 100b in accordance with a third embodiment of the disclosure is shown. The light emitting diode assembly 100b has a configuration similar to the light emitting diode assembly 100 of the first embodiment. What is different from the light emitting diode assembly 100 is that, the light emitting diode assembly 100b further includes a light reflective cup 60 fixed on the substrate 12. The light reflective cup 60 is made of light reflective materials. The light reflective cup 60 has a tubular shape. The light reflective cup 60 is arranged between the light emitting chip 20 and the two rotation members 30. As such, the light emitting chip 20 is surrounded by the light reflective cup 60. The light reflective cup 60 has an inner diameter gradually decreasing along a vertical direction from the lens 40 to the substrate 12. Therefore, the light reflective cup 60 has an inclined inner sidewall functioning as a light reflecting surface 61. The light reflecting surface 61 extends from the lens 40 downward and slantwise towards the light emitting chip 20. As such, light emitted from the light emitting chip 20 can be reflected towards the lens 40 by the light reflecting surface 61, thereby improving a brightness of the light emitting diode assembly 100b.

Figure 7:
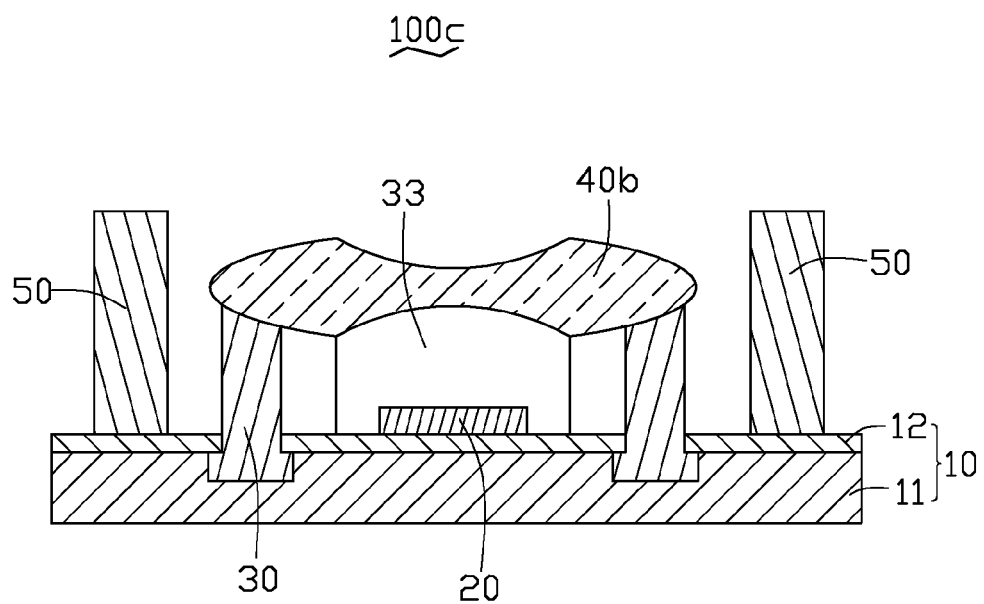
FIG. 7 is a cross-sectional view of a light emitting diode assembly according to a fourth embodiment of the present disclosure.

Referring to FIG. 7, a light emitting diode assembly 100c in accordance with a fourth embodiment of the disclosure is shown. The light emitting diode assembly 100c has a configuration similar to the light emitting diode assembly 100 of the first embodiment. What is different from the light emitting diode assembly 100 is that, the light emitting diode assembly 100c employs a biconcave lens 40b instead of the lens 40 of the light emitting diode assembly 100 which is a biconvex lens. A central thickness of the lens 40b is smaller than peripheral thickness thereof. In this embodiment, the lens 40b has a thickness firstly gradually increasing and then gradually decreasing along a direction from a center to a periphery edge thereof.

Due to that the lenses 40, 40b can be rotated and the stopper poles 50 is capable of compressing the lenses 40, 40b to cause the lens 40, 40b to deform resiliently, the light modulating capabilities of the lenses 40, 40b can be modified to satisfy various illumination requirements.

In the above disclosed embodiments, the lens 40 is rotatable while the stopper poles 50 are fixed. Alternatively, the lens 40 and the rotation members 30, 30a can be fixed while the stopper poles 50 are rotatable, as long as the lenses 40, 40b can be compressed by the stopper poles 50 when the stopper poles 50 are rotated around a center of the light emitting diode assembly 100 (100a, 100b, 100c).

It is to be further understood that even though numerous characteristics and advantages have been set forth in the foregoing description of the embodiment(s), together with details of the structures and functions of the embodiment(s), the disclosure is illustrative only; and that changes may be made in detail, especially in the matters of shape, size, and arrangement of parts within the principles of the disclosure to the full extent indicated by the broad general meaning of the terms in which the appended claims are expressed.

What is claimed is:
1. A light emitting diode assembly, comprising:
a base;
a light emitting chip mounted on the base;
an elastic lens covering the light emitting chip;
two rotation members rotatably arranged on the base; and
two stopper poles fixed on the base, wherein the two rotation members are capable of driving the elastic lens to rotate with respect to the two stopper poles, and the stopper poles compress the elastic lens to cause the elastic lens to deform resiliently when the elastic lens is rotated by the rotation members to engage with stopper poles;
wherein the two rotation members each comprise a curved wall and a foot connected with a bottom of the curved wall, the curved wall being perpendicular to the base, the foot being slideably engaged with the base;
the base comprises a rear plate and a substrate attached to a top surface of the rear plate, the rear plate being parallel to the substrate;
the rear plate comprises an annular receiving groove formed in the top surface thereof, the substrate comprises an annular slot directly over the annular receiving groove and penetrating through the substrate along a thickness direction thereof, and the annular receiving groove and the annular slot are concentric and communicated with each other;
the annular receiving groove has a width, along a radius direction thereof, larger than that of the annular slot.

2. The light emitting diode assembly of claim 1, wherein the two rotation members are arranged at two opposite sides of the light emitting chip, and apart from and facing towards each other.

3. The light emitting diode assembly of claim 1, wherein the two stopper poles are arranged at two opposite sides of the two rotation members.

4. The light emitting diode assembly of claim 1, wherein the two stopper poles each have a height, along a direction away from and perpendicular to the base, no less than that of the elastic lens.

5. The light emitting diode assembly of claim 1, wherein the two stopper poles each have a column shape.

6. The light emitting diode assembly of claim 1, wherein the two stopper poles are both perpendicular to the base.

7. The light emitting diode assembly of claim 1, wherein the elastic lens is made of transparent and resilient material.

8. The light emitting diode assembly of claim 1, wherein the elastic lens is made of one of silica gel and transparent rubber.

9. The light emitting diode assembly of claim 1, wherein an orthographic projection of the elastic lens on the base is an ellipse, a distance between the two stopper poles being smaller than a length of the major axis of the ellipse and larger than a length of the minor axis of the ellipse.

10. The light emitting diode assembly of claim 1, wherein the elastic lens is fixed on and supported by the two rotation members.

11. The light emitting diode assembly of claim 1, wherein each curved wall has an arc-shaped configuration as viewed from a top thereof.

12. The light emitting diode assembly of claim 1, wherein the foot extends inward and outward from the bottom of the curved wall along radius directions of the annular slot and the annular receiving groove.

13. The light emitting diode assembly of claim 12, wherein the foot is fittingly and slideably embedded in the annular receiving groove, and the bottom of the curved wall is fittingly and slideably embedded in the annular slot.

\* \* \* \* \*